United States Patent
Hu et al.

(10) Patent No.: US 10,354,356 B2
(45) Date of Patent: Jul. 16, 2019

(54) SYSTEMS AND METHODS FOR INTERCONNECTING AND COOLING MULTIPLE GRAPHICS PROCESSING UNIT (GPU) CARDS

(71) Applicant: DELL PRODUCTS L.P., Round Rock, TX (US)

(72) Inventors: Chih-Tsung Hu, New Taipei (TW); Yu Sheng Chang, Taishan Dist. (TW)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/802,054

(22) Filed: Nov. 2, 2017

(65) Prior Publication Data

US 2019/0130519 A1    May 2, 2019

(51) Int. Cl.
| | |
|---|---|
| *G06T 1/20* | (2006.01) |
| *H05K 7/20* | (2006.01) |
| *G06F 1/20* | (2006.01) |
| *G06F 1/16* | (2006.01) |

(Continued)

(52) U.S. Cl.
CPC .............. *G06T 1/20* (2013.01); *G06F 1/1613* (2013.01); *G06F 1/203* (2013.01); *G06F 3/1407* (2013.01); *G06F 15/163* (2013.01); *H05K 7/20136* (2013.01); *H05K 7/20409* (2013.01); *G06T 2210/52* (2013.01)

(58) Field of Classification Search
None
See application file for complete search history.

(56) References Cited

U.S. PATENT DOCUMENTS

| | | | |
|---|---|---|---|
| 6,285,550 B1 * | 9/2001 | Belady | H01L 23/467 165/104.33 |
| 6,365,260 B1 * | 4/2002 | Stecher | H01L 23/427 165/104.26 |

(Continued)

OTHER PUBLICATIONS

North et al., Apparatus and Methods for Characterizing a Heat Pipe and for Controlling an Operating Parameter of at Least One Heat Generating Component Coupled to the Heat Pipe, U.S. Appl. No. 15/585,509, filed May 3, 2017, 38 pgs.

(Continued)

*Primary Examiner* — Joni Richer
(74) *Attorney, Agent, or Firm* — Egan Peterman Enders Huston

(57) ABSTRACT

Systems and methods are provided that may be implemented to electronically link together and cool multiple graphics boards (also known as graphics cards) within an information handling system chassis, such as notebook computer chassis. The multiple graphics boards may be positioned at different levels relative to each other, and may be mounted separate from the main board (e.g., motherboard) in order to achieve a reduced total projective printed circuit board (PCB) area for the combination of the multiple graphics boards and main board. The multiple graphics boards may be stacked on opposite sides of the same thermal cooling module to allow a common thermal cooling module to simultaneously cool a GPU of each of the multiple linked graphics boards, as well as one or more other processors (e.g., central processing units and/or chipsets) mounted to the main board of the system.

19 Claims, 11 Drawing Sheets

(51) Int. Cl.
  *G06F 3/14* (2006.01)
  *G06F 15/163* (2006.01)

(56) References Cited

U.S. PATENT DOCUMENTS

| | | | | |
|---|---|---|---|---|
| 6,791,553 | B1* | 9/2004 | Lefebvre | G06F 3/1407 |
| | | | | 345/504 |
| 7,969,733 | B1* | 6/2011 | Abbay | G06F 1/20 |
| | | | | 165/104.33 |
| 8,319,782 | B2 | 11/2012 | Casparian et al. | |
| 9,405,336 | B1* | 8/2016 | Li | H05K 7/20 |
| 9,558,527 | B2 | 1/2017 | Sierra et al. | |
| 2002/0062648 | A1* | 5/2002 | Ghoshal | F28D 15/0233 |
| | | | | 62/3.7 |
| 2005/0007748 | A1* | 1/2005 | Callahan | H05K 7/1061 |
| | | | | 361/809 |
| 2005/0041031 | A1* | 2/2005 | Diard | G06T 15/005 |
| | | | | 345/505 |
| 2005/0183437 | A1* | 8/2005 | Gravina | F25B 1/00 |
| | | | | 62/298 |
| 2006/0278370 | A1* | 12/2006 | Rockenfeller | H01L 23/427 |
| | | | | 165/104.33 |
| 2010/0097769 | A1* | 4/2010 | Lin | G06F 1/20 |
| | | | | 361/720 |
| 2010/0300656 | A1* | 12/2010 | Lu | F28D 15/0266 |
| | | | | 165/104.26 |
| 2011/0316448 | A1* | 12/2011 | Ashdown | G09G 3/3426 |
| | | | | 315/297 |
| 2016/0120019 | A1* | 4/2016 | Shedd | H05K 1/0204 |
| | | | | 361/679.47 |
| 2017/0220505 | A1 | 8/2017 | Breakstone et al. | |

OTHER PUBLICATIONS

Wikipedia, "Scalable Link Interface", Printed From Internet Sep. 23, 2017, 5 pgs.
Wikipedia, "Mobile PCI Express Module", Printed From Internet Sep. 23, 2017, 4 pgs.
Samtec, "Z-Ray Ultra-Low Profile Arrays", Printed from Internet Sep. 25, 2017, 13 pgs.
Smiths Interconnect, "Interposers-Contact Array", Printed from Internet Sep. 25, 2017, 3 pgs.
Glaser, "Review Alienware 18 Notebook", Sep. 28, 2013, 20 pgs.
Smith, "MSI GT83VR Titan SLI Review", Jan. 20, 2017, 11 pgs.

* cited by examiner

SYSTEMS AND METHODS FOR INTERCONNECTING AND COOLING MULTIPLE GRAPHICS PROCESSING UNIT (GPU) CARDS

FIELD

This invention relates generally to information handling systems and, more particularly, to multiple GPU cards for information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

NVIDIA Scalable Link Interface (SLI) is a technology for linking together graphics processing units (GPUs) of multiple video card boards to employ parallel processing to produce a single video output having scaled-up graphics performance from the linked GPUs. FIG. 1A illustrates a simplified side cross-sectional view of the stackup of a conventional SLI architecture 100 that has been implemented in the past to link two modular graphics boards (printed circuit boards) 102a and 102b within a notebook computer chassis having a width of at least 17 inches. Each of the two graphics boards 102a and 102b includes a graphics processing unit (GPU) not shown in FIG. 1A, and is mounted to the same side of a main motherboard 104 of the notebook computer. As shown, each of graphics boards 102a and 102b is also mechanically mounted in the same plane (or at the same level) as the other graphics board, and the plane of both graphics boards 102a and 102b is mounted parallel to the plane of the motherboard 104.

Still referring to FIG. 1A, the circuitry and GPU of each graphics board 102a and 102b is electrically linked to circuitry and a central processing unit (CPU) 125 on the motherboard 104 through a separate respective mobile peripheral component interconnect express (PCIe) module (MXM) connector (socket) 106a or 106b as shown. For purposes of illustration, the graphics boards 102, MXM connectors 106 and main motherboard 104 are shown in exploded view with respect to each other to illustrate the signals communicated therebetween. As shown, each of MXM connectors 106a and 106b transfers electrical signals 111 (including graphics board power supply, PCIe bus signals) between the CPU 125 of motherboard 104 and a respective GPU of one of graphics boards 102a and 102b. As further shown in FIG. 1, each of graphics boards 102a and 102b is also mechanically mounted to the motherboard 104 by one of the MXM connectors 106. A thermal cooling module 107c including a heat sink is mechanically mounted in a thermally-conductive manner to the CPU 125 on motherboard 104, which is located in the motherboard area between the two graphics boards 102a and 102b. The thermal cooling module 107c is provided for cooling the CPU 125 of the motherboard 104. Separate thermal cooling modules 107a and 107b including separate heat sinks are mechanically coupled in a thermally-conductive manner to cool the respective separate GPUs of graphics boards 102a and 102b. Each of the separate thermal cooling modules 107 are isolated from, and operate separately from, the other thermal cooling modules 107 as further described below in relation to FIGS. 1B and 1C.

In the conventional configuration of FIG. 1A, motherboard 104 has a side-to-side width ($CW_M$) that supports the two MXM connectors 106a and 106b in position for connection to the respective graphics boards 102a and 102b. As shown, graphics boards 102a and 102b have respective board widths ($CWG_{GA}$) and ($CWG_{GB}$), and a space ($CS_P$) exists between the two graphics boards 102a and 102b to accommodate heat sink of thermal module 107c. A SLI bridge cable 103 is provided to span the space ($S_P$) to interconnect the graphics boards 102a and 102b in master-slave relationship as shown. SLI bridge cable 103 transfers inter-graphics board signals 121 (multiuse Input/Output Interface signals) between the graphics boards 102a and 102b. The GPU of the master graphics board 102a provides output video signals 131 (such as HDMI, DVI, or SVGA) to an attached display device (such as LED or LCD display device).

FIG. 1B illustrates an underside view of a notebook computer chassis 175 of a notebook computer that contains a conventional SLI architecture 100 received in the bottom portion of the notebook computer chassis. As shown, three separate heat pipe sets 160a, 160b and 160c are provided and coupled to the separate heat sinks (indicated by dashed outline) of separate thermal modules 107a, 107b and 107c, respectively. Each of the separate heat pipe sets 160a, 160b and 160c is coupled between a single heat sink and a single separate conductive block that is cooled by a separate cooling fan 182a, 182b or 182c, respectively. Thus, the processor of each of graphics boards 102a, 102b and CPU 125 of motherboard 104 is cooled by a separate cooling system (i.e., thermal cooling module/heat sink, heat pipe set, conductive block and cooling fan) that is completely separate from the cooling systems that is used to cool the other processors, i.e., requiring a total of three separate cooling systems. In this regard, FIG. 1C illustrates an overhead view of the conventional SLI architecture 100 of FIG. 1B, in which the three separate cooling fans 182a, 182b and 182c are visible on top of motherboard 104.

Referring again to FIG. 1B, a projective PCB area of the conventional SLI architecture 100 of FIG. 1B is a surface area defined by the outermost boundary edges of motherboard 104 that exist within the width ($CW_M$) and depth ($CD_M$) of motherboard 104 that is employed to support the graphics board PCB components 102a and 102b and needed circuitry as shown, i.e., conventional projective PCB area=$CW_M \times CD_M$. In this regard, the outer dimensions of motherboard 104 is large enough so that graphics boards 102a and 102b lie completely within the outer boundaries of motherboard 104 when stacked on top of the motherboard 104. Conventional MXM-compatible graphics cards 102a and 102b (up to 100 watts maximum) each has outer dimensions of 105 millimeters wide×82 millimeters deep, and a conventional motherboard 104 employed to support two conventional side-by-side MXM-compatible graphics cards 102a and 102b has outer dimensions ($CW_M$) of 436.8 millimeters wide×158 millimeters deep that define a projective PCB area. Overall stack height of the conventional SLI architecture 100 of FIGS. 1A-1C between (and including) thermal modules 107a/107b/107c as well as graphics cards 102a/102b and motherboard 104 ranges from 30 millimeters to 50 millimeters at different points in the stackup of FIGS. 1A-1C. In another conventional SLI architecture, a narrowed "neck" section of the motherboard (i.e., having a neck width of 240 millimeters) has been utilized that allows room for cooling fans to be positioned on either side of the motherboard with the narrowed 240 millimeter-wide neck area positioned therebetween.

A 17-inch wide notebook computer chassis or larger is required to contain the outer dimensions and projective PCB area of the conventional SLI architecture 100 of FIGS. 1A-1C, which requires a motherboard 104 to bear the MXM connector sockets 106. Moreover, due to the relatively large projective PCB area corresponding to the large area of motherboard 104 that is required to support the dual graphics boards 102a and 102b, available space within a chassis enclosure for the system thermal solution is limited. Additionally, the maximum useable size of cooling system fans and graphics boards are limited for a given chassis enclosure size. In this regard, graphics boards 102 are limited to 100 watts maximum power for a 17-inch wide notebook computer installation. A further increase in motherboard projective PCB area and notebook chassis size may be required if power of graphics boards 102 is increased above 100 watts and/or larger cooling fans are desired. Further, three separate individual cooling systems are employed to separately cool each of the three respective separate processors (CPU and two GPUs) of conventional SLI architecture 100 due to the relatively large distance between the three processors (CPU and two GPUs) and effective heat pipe length limitations, which results in a complicated thermal solution that is relatively difficult to maintain.

SUMMARY

Disclosed herein are systems and methods that may be implemented to link together and cool multiple graphics boards (also known as graphics cards) within an information handling system chassis, such as notebook computer chassis. In one embodiment, the multiple graphics boards may be positioned at different levels relative to each other, and may be mounted separate from the main board (e.g., motherboard) in order to achieve a reduced total projective printed circuit board (PCB) area for the combination of the multiple graphics boards and main board. In one embodiment, the multiple graphics boards may be stacked on opposite sides of the same thermal cooling module to allow a common thermal cooling module to simultaneously cool a GPU of each of the multiple linked graphics boards at the same time. In a further embodiment, the same common thermal cooling module may be thermally coupled to also cool one or more processors (e.g., central processing units and/or chipsets) mounted to the main board of the system. Using the disclosed systems and methods, the graphics processing units (GPUs) of multiple video card boards may be electrically linked together to produce a single video output having scaled-up graphics performance provided from the linked GPUs, while at the same time achieving a reduced total projective PCB area and while using a simplified cooling solution as compared to a conventional multi-graphics board SLI architecture.

In one embodiment, one or more separate connectors may be provided on the main board to couple electrical signals between the main board CPU/s and the GPUs of the graphics boards, and to conduct a power supply to the multiple graphics boards. In one embodiment, one or more relatively smaller contact array interposers may be provided on the main board for providing a power level to the graphics board that is greater than the maximum provided power level that is possible with relatively larger MXM connectors used by a conventional multi-graphics board SLI architecture. Thus, a multiple graphics board architecture of the disclosed systems and methods may be provided in one exemplary embodiment that employs multiple graphic boards stacked with a thermal cooling module so as to reduce the projective PCB area to fit in smaller information handling system chassis (e.g., such as 15-inch wide or smaller notebook computer form factor chassis), while at the same time using contact array interposers that are smaller than conventional MXM connectors in order to support newer and higher power GPUs that cannot be supported by a conventional SLI architecture.

In one embodiment, higher power graphic cards may be supported together with cooling components and a main board in a SLI configuration within the same or smaller size (narrower width and/or depth) and volume notebook computer chassis enclosure than is required to support conventional SLI architecture conventional notebook computer systems. This allows scaled-up SLI graphics performance to be provided by the same or smaller-size notebook computer in one embodiment, e.g., such as to provide SLI graphics performance in a 15 inch form factor notebook computer chassis platform. In another embodiment, PCB complexity and cost reduction may be realized by also or alternatively leveraging a CPU main board of the disclosed multiple graphics board architecture in non-SLI applications (e.g., such as a notebook PC having just only CPU and a single GPU, or a CPU-only PCB, etc.) and different sized platforms. In yet another embodiment, an integrated concurrence thermal module design may be employed that makes the graphic board/s easy to assemble, replace and/or upgrade, while at the same time reducing service cost. In a further embodiment, a single integrated concurrence (use of one thermal module to conduct multiple heat sources from CPU and GPU to heat exchanger/s) of a thermal module may be employed to cool multiple processing devices in a manner that reduces the thermal module complexity and cost.

In one respect, disclosed herein is a system, including: multiple graphics boards, each of the multiple graphics boards including at least one graphics processing unit (GPU) mounted to a printed circuit board (PCB); and a thermal module disposed between at least a first graphics board and a second graphics board of the multiple graphics boards, the thermal module being thermally coupled to simultaneously absorb heat from each of a GPU of the first graphics board and a GPU of the second graphics board.

In another respect, disclosed herein is an information handling system, including: a chassis enclosure; multiple graphics boards contained within the chassis enclosure, each of the multiple graphics boards including at least one graphics processing unit (GPU) mounted to a printed circuit board (PCB); and a main board contained within the chassis enclosure that includes at least one host processing device mounted to a PCB, the main board having opposing first and second sides and having a plane being disposed between a plane of a first one of the multiple graphics boards and a plane of a second one of the multiple graphics boards with the plane of the main board being oriented parallel to the plane of the first graphics board and the plane of the second graphics board. The GPU of the first graphics board may be coupled in signal communication with the host processing device by at least one first contact array interposer mounted to the first side of the main board; and the GPU of the second graphics board may be coupled in signal communication with the host processing device by at least one second contact array interposer mounted to the second side of the main board.

In another respect, disclosed herein is a method, including: operating separate graphics processing units of multiple graphics boards contained within a chassis enclosure of an information handling system, the multiple graphics boards including at least a first graphics board and a second graphics board, and each of the multiple graphics boards including at least one graphics processing unit GPU mounted to a printed circuit board (PCB); operating at least one host processing device of a main board contained within the chassis enclosure, the main board including the at least one host processing device mounted to a PCB; and operating a thermal module contained within the chassis enclosure and disposed between the first graphics board and the second graphics board to simultaneously absorb heat from each of the host processing device, the GPU of the first graphics board and the GPU of the second graphics board.

DESCRIPTION OF ILLUSTRATIVE EMBODIMENTS

Figure 1A:
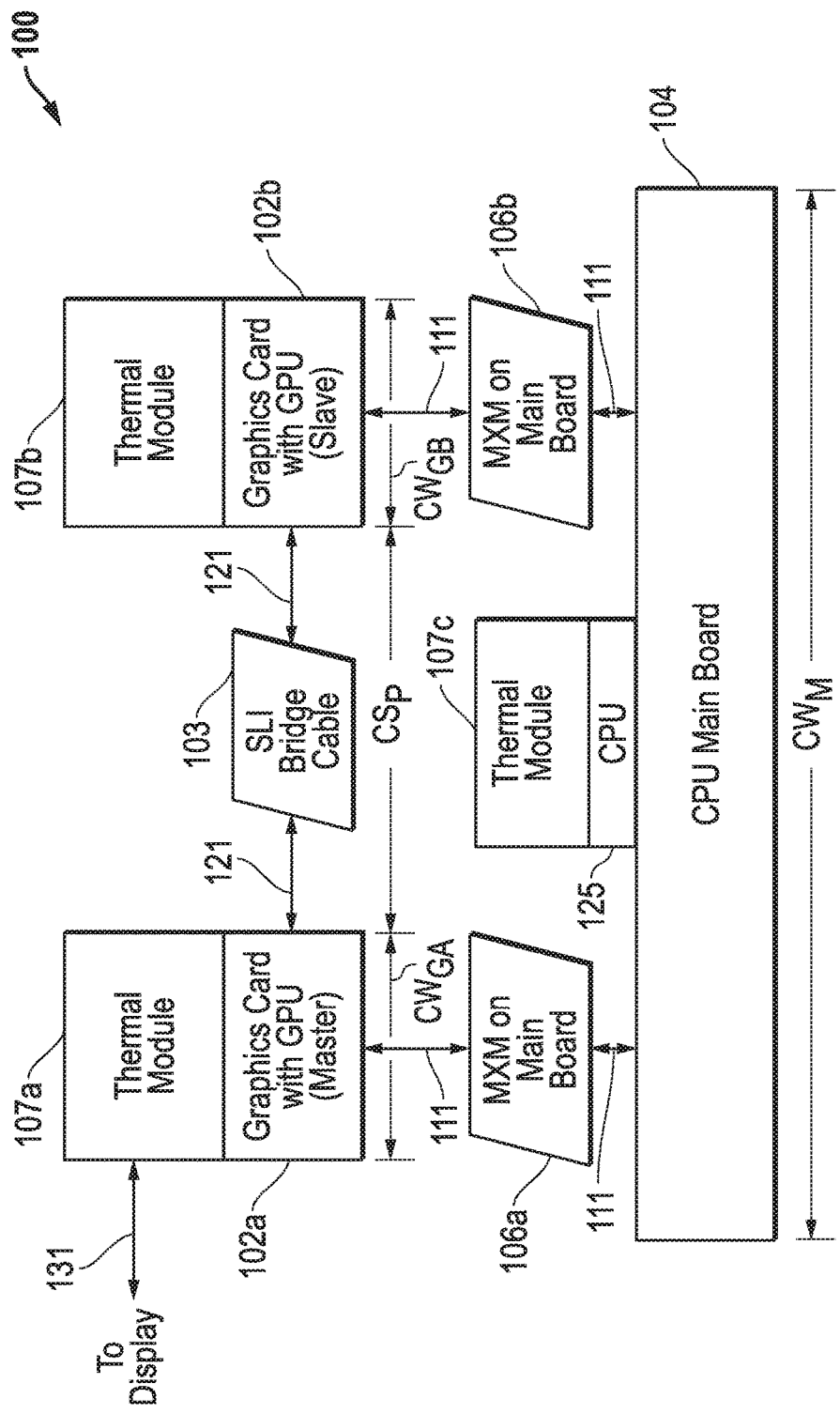
FIG. 1A illustrates a simplified side view of a conventional SLI architecture stackup.
Figure 1B:
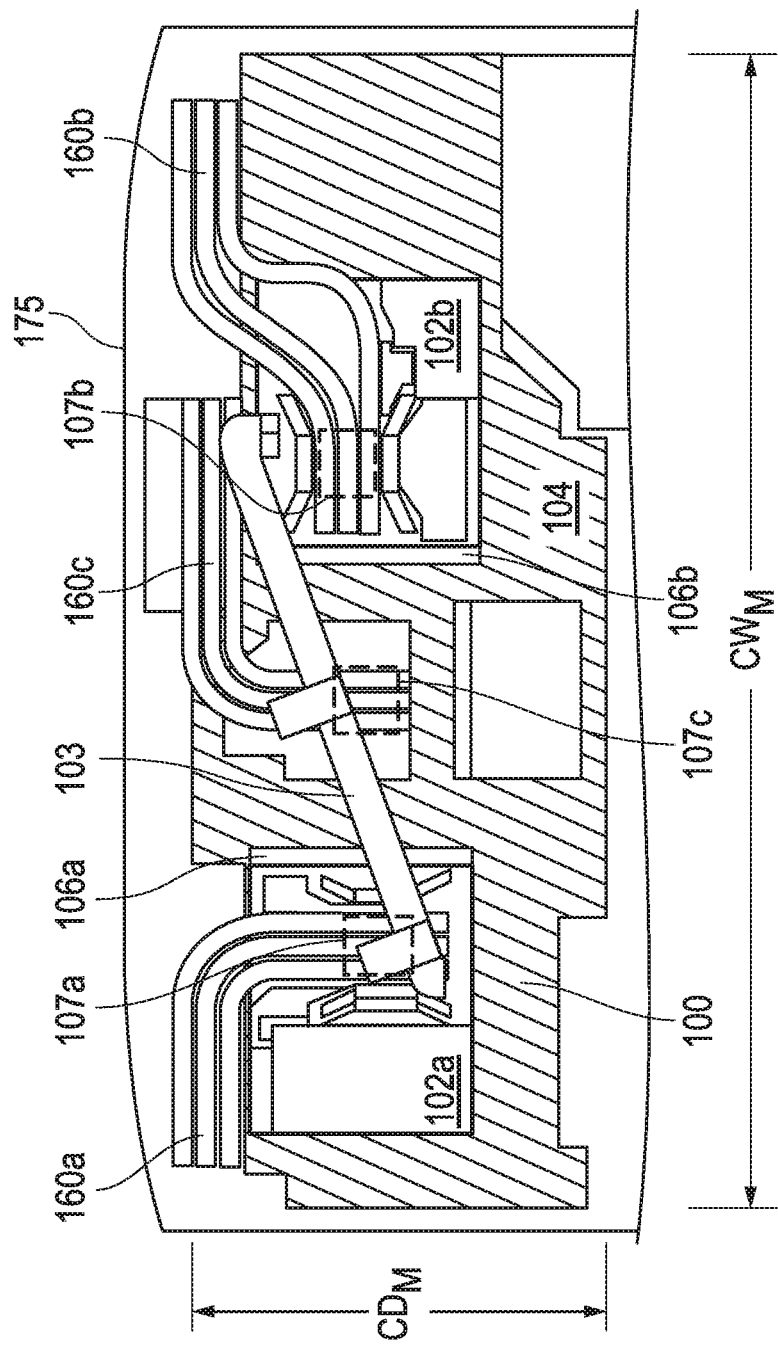
FIG. 1B illustrates an underside view of conventional SLI architecture stackup of FIG. 1A.
Figure 1C:
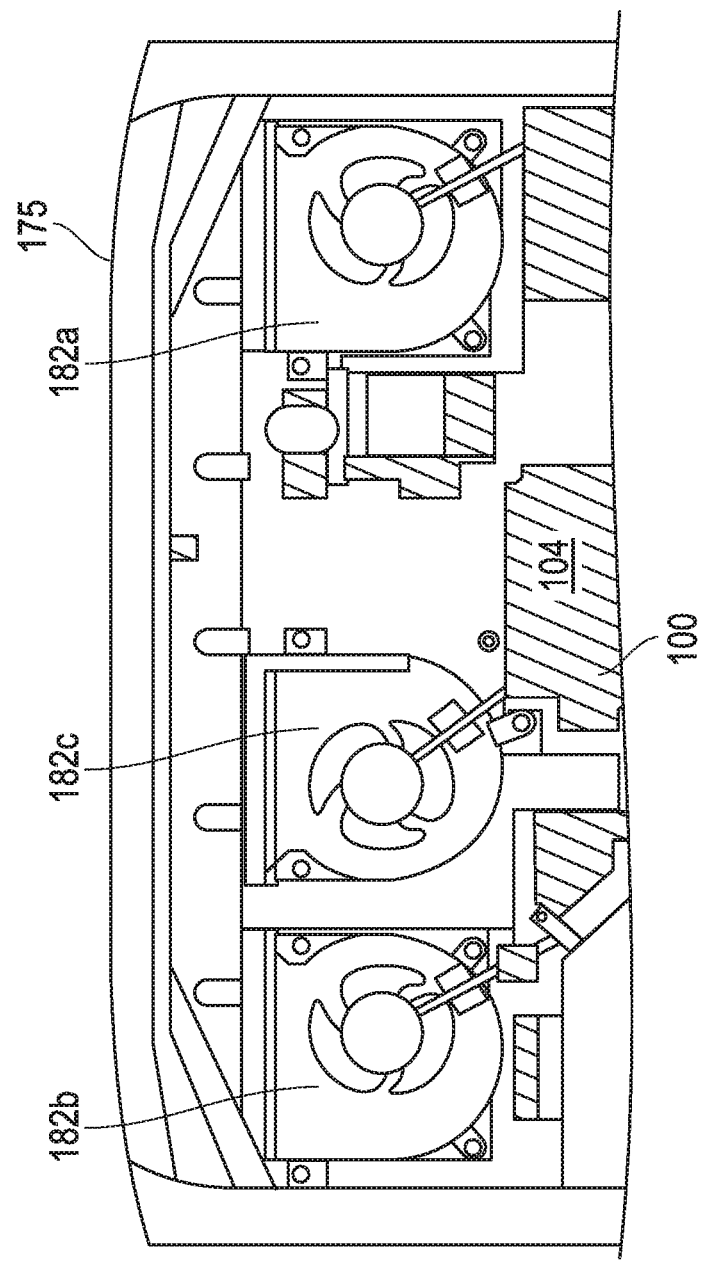
FIG. 1C illustrates an overhead view of conventional SLI architecture stackup of FIG. 1A.
Figure 2:
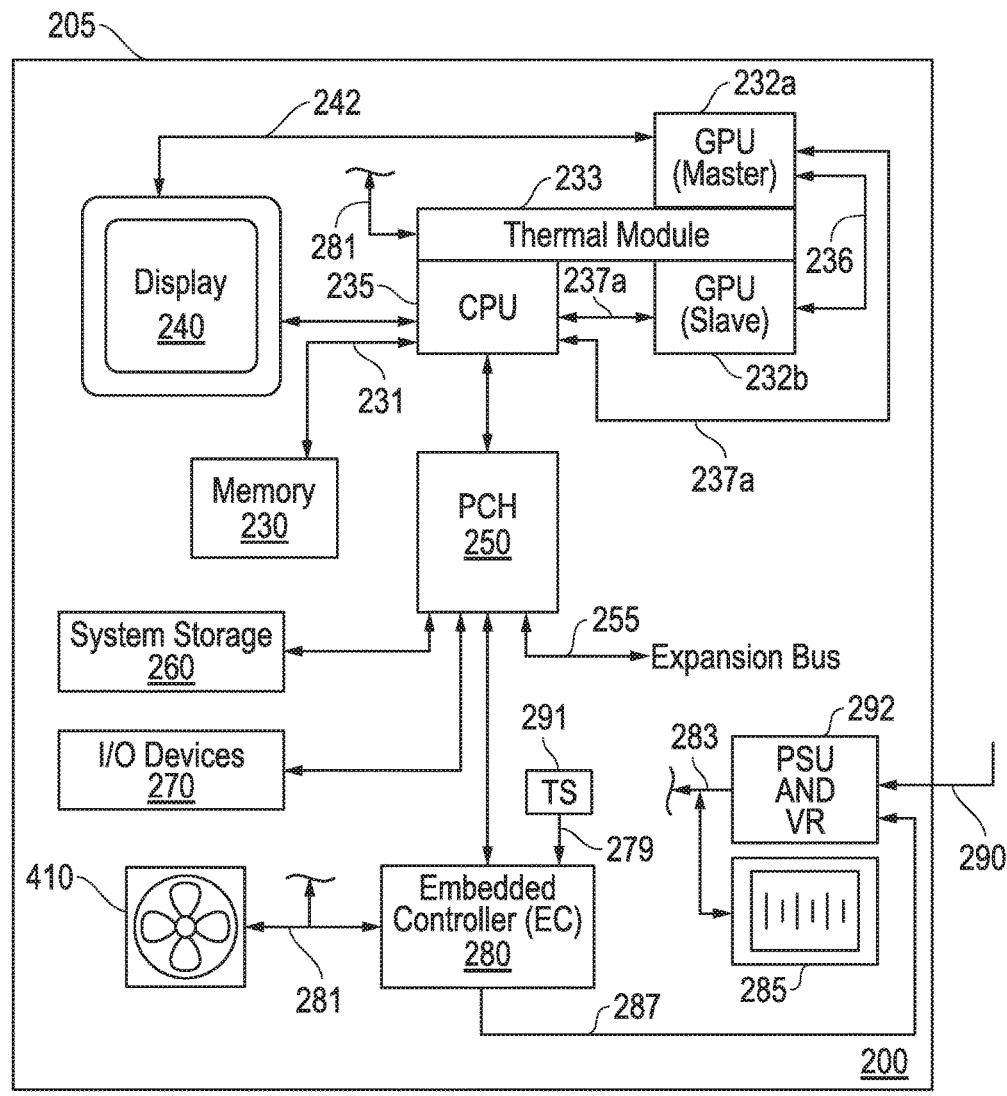
FIG. 2 illustrates a simplified block diagram of an information handling system according to one exemplary embodiment of the disclosed systems and methods.

FIG. 2 is a block diagram of an information handling system 200 (e.g., a portable information handling system such as a notebook computer, tablet computer, convertible computer, etc.) as it may be configured according to one embodiment of the disclosed systems and methods. As shown in FIG. 1, information handling system 200 may include a chassis enclosure 205 (e.g., plastic enclosure, sheet metal enclosure, etc.) that encloses internal components of the information handling system 200 therein. It will be understood that the outer dimensions and shape of the chassis enclosure 205 may vary according to the type and/or number of internal components of the system 200, and that chassis enclosure 205 may have a shape or configuration suitable for the particular application for which the system 200 is designed (e.g., two-piece hinged clam shell enclosure for a notebook computer, single-piece unitary enclosure for a tablet computer, etc.). In this regard, it will be understood that the configuration of FIG. 1 is exemplary only, and that the disclosed apparatuses and methods may be implemented with other types of information handling systems.

As shown in FIG. 2, information handling system 200 includes at least one host processing device configured in this embodiment as a central processing unit (CPU) 235 that executes an operating system (OS) for system 200. CPU 235 may include, for example, an Intel Xeon series processor, an Advanced Micro Devices (AMD) processor or another type of processing device. Also shown in FIG. 2 are dual graphics processing units (GPUs) 232a and 232b that are coupled together in master-slave relationship by a Scalable Link Interface (SLI) bridge cable 236, and that are each separately coupled in signal communication with CPU 235 by a flexible printed circuit cable 237a or 237b (e.g., each including signals such as PCI-Express lanes, power supply bus, power, thermal and system management signals, etc.) or other suitable signal conductor/s that transfers instructions and data for generating video images from CPU 235 to the GPUs 232a and 232b Each of GPUs 232a and 232b may include an Nvidia GeForce series processor, an AMD Radeon series processor, or another type of processing device that is configured to perform graphics processing tasks, as well as to perform parallel processing in cooperation with the other GPU 232 in a master-slave relationship using communication across SLI bridge cable 236. In this regard, SLI bridge cable 236 communicates video output data signals between GPUs 232a and 232b, e.g., such as the final rendered graphics output signal for a portion of a video image from the slave GPU 232b to the master GPU 232a, which combines the rendered signal of the slave GPU 232b with its own rendered signal to produce the final video image (e.g., a graphical user interface, static images and/or video image content) to the user. Master GPU 232a may provide the combined final rendered video image (e.g., as frame buffer data) by output digital video signals 242 (e.g., HDMI, DVI, SVGA, VGA, etc.) to integrated display 240 (e.g., LED display, LCD display, or other suitable type of display device) of system 200.

Still referring to the exemplary embodiment of FIG. 2, CPU 235 is shown coupled to system memory 230 via data channel 231. System memory 230 may include, for example, random access memory (RAM), read only memory (ROM), dynamic RAM (DRAM), synchronous DRAM (SDRAM), and/or other suitable storage mediums. CPU 235 is also coupled to platform controller hub (PCH) 250, which facilitates input/output functions for information handling system 200. Local system storage 260 (e.g., one or more media drives, such as hard disk drives, optical drives, non-volatile random access memory "NVRAM", Flash or any other suitable form of internal storage) is coupled to PCH 250 to provide non-volatile storage for the information handling system 200. Input/output devices 270 (e.g., a keyboard, touchpad, touchscreen, etc.) are coupled to PCH 250 as shown to enable the user to interact with components of information handling system 200 including application programs or other software/firmware executing thereon. In some embodiments, an expansion bus 255 may be coupled to PCH 250 to provide information handling system 200 with additional plug-in functionality. Expansion bus 255 may be, for example, a peripheral component interconnect (PCI) bus, peripheral component interconnect express (PCIe) bus, SATA bus, USB or any other suitable expansion bus.

In the embodiment of FIG. 2, an embedded controller (EC) 280 is coupled to PCH 250 and is configured to perform out-of-band and system tasks including, but not limited to, providing control signals 287 to control operation of power supply/voltage regulation circuitry 292 that itself receives external power 290 (e.g., direct current power from an AC adapter or alternating current from AC mains) and in turn provides suitable regulated and/or converted direct current power 283 for operating the system power-consuming components and for charging system battery pack 285. EC 280 may also supply control signals 281 for thermal management (e.g., to control cooling fans 410 and/or monitor operating temperature of thermal module 233, to control processing device (CPU 235 and/or GPU 232) power throttling, etc.) based on internal system temperature measurement signals 279 received from one or more temperature sensors 291 inside chassis enclosure 205. It will be understood that one or more such tasks may alternatively or additionally be performed by other processing device/s of an information handling system 200.

Figure 3:
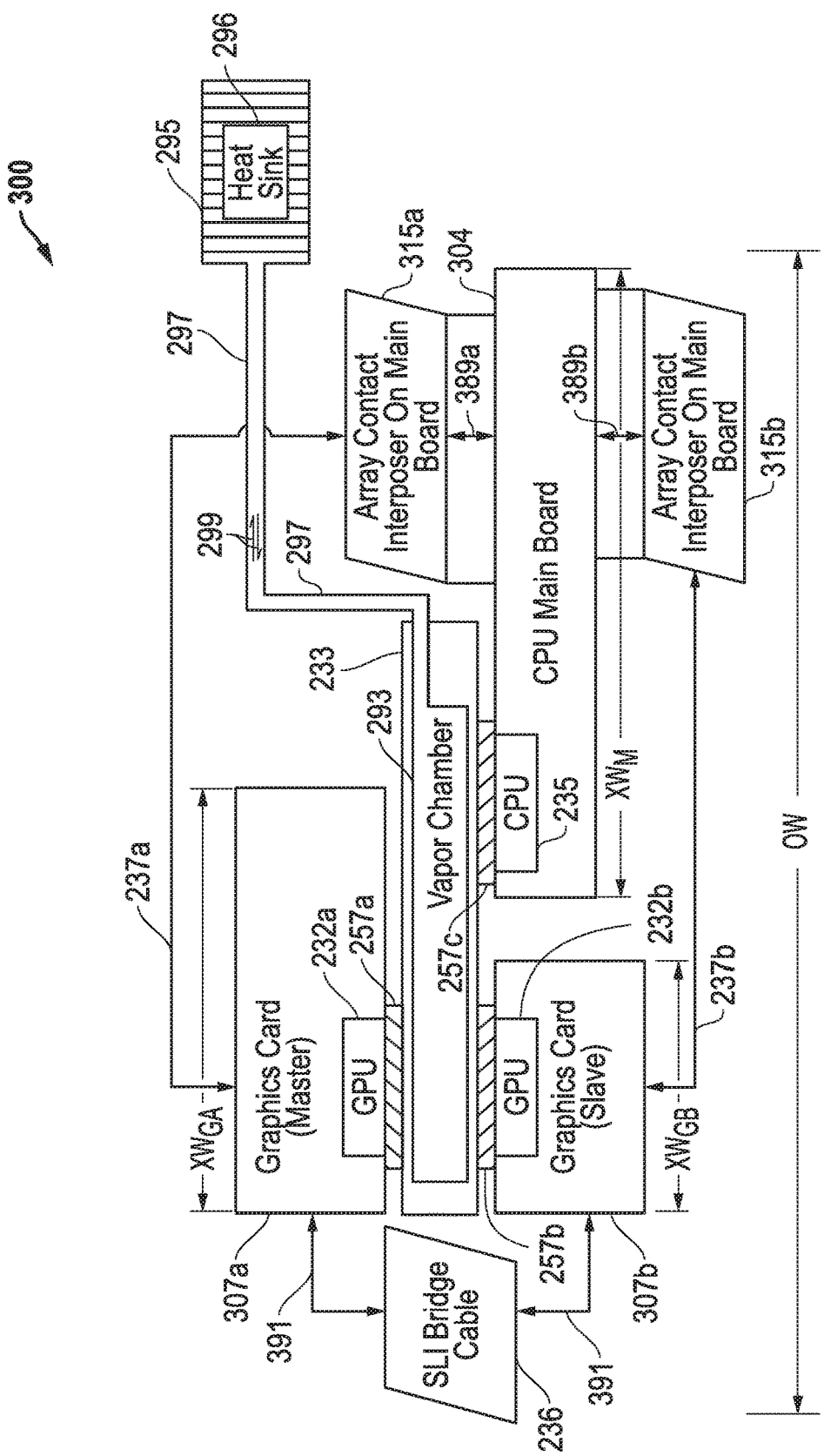
FIG. 3 illustrates a simplified side view of a multiple graphics board architecture stackup according to one exemplary embodiment of the disclosed systems and methods.

FIG. 3 illustrates a simplified side cross-sectional view of the stackup of a multiple graphics board architecture 300 as it may be operationally implemented within information handling system 200 of FIG. 2 according to one exemplary embodiment of the disclosed systems and methods. In FIG. 3, two graphics boards 307*a* and 307*b* are provided that each include circuitry and at least one GPU 232*a* or 232*b* mounted on a printed circuit board. Although a dual graphics board embodiment is illustrated in FIG. 3, it will be understood that the disclosed systems and methods may be implemented to operationally couple together and cool three or more graphics boards. As shown in FIG. 3, graphics boards 307*a* and 307*b* are mechanically mounted on opposite sides of a common double-sided thermal module 233 and, in particular, the GPU 232 of each graphics board 307 is mounted or otherwise coupled in a thermally-conductive manner to a heat absorbing surface 257*a* or 257*b* provided on one of the opposing sides of the thermal module 233. e.g., mounting each of the GPUs 232 on and in contact with vapor chamber of thermal module 233 using screws with a spring fastened from one side of PCB to another side of PCB. At the same time the CPU 235 of main board 304 (e.g., motherboard) is also mechanically mounted other otherwise coupled in a thermally-conductive manner to a heat absorbing surface 257*c* provided on one of the opposing sides of the thermal module 233 as shown. It will be understood, however, in other embodiments GPUs 232 of multiple graphics boards 307 may be mounted in a thermally-conductive manner to separate heat absorbing surfaces 257 provided on opposing sides of a thermal module 233 without the presence of a CPU 235 and/or main board 304.

In one exemplary embodiment, thermal module 233 may include at least one double-sided vapor chamber block (evaporator) that is thermally coupled to heat absorbing contact surfaces 257*a*, 257*b* and 257*c* disposed on opposite sides of the thermal module 233 as shown. As used herein, "thermally coupled" means a configuration which allows heat to be transferred from a component that is a source of heat to another component through a direct connection (such as when a heat source component is in physical contact with a heat-absorbing component) or an indirect connection (e.g., via conduction, convection and/or radiation of thermal energy).

In the embodiment of FIG. 3, the thermal module 233 is an integrated concurrence thermal module that includes a vapor chamber block having a vapor chamber 293 defined therein that is coupled by a conductor in the form of a fluid-conducting heat pipe 297 to be in sealed fluid communication with a condenser chamber 296 of a heat sink (e.g., fin-fan heat exchanger) 295. In this embodiment, vapor chamber block of thermal module 233 has double-sided heat source contacts 257*a* and 257*b* for heat spreading from two graphics boards 307*a* and 307*b* to transfer the heat to heat sink 295 via vapor chamber 293 and heat pipe/s 297. In operation of system 200, heat simultaneously absorbed by contact surfaces 257*a*, 257*b* and 257*c* of thermal module 233 from respective operating GPUs 232*a*, 232*b* and CPU 235 acts to vaporize a working fluid 299 (e.g., water, Freon, methyl alcohol, etc.) into a gas in the vapor chamber 293 of the thermal module 233. The heat pipe 297 of the thermal module 233 allows the vaporized cooling fluid (gas) 299 to flow from the vapor chamber block to the condenser chamber 296 that is thermally coupled to heat sink 295, thus transferring the heat from CPU 235 and GPUs 232*a* and 232*b* to the heat sink 295 via the vapor chamber 293 and heat pipe 297 during system operation so as to cool these components 232 and 235. Heat sink 295 may be provided in one embodiment with cooling fins that are cooled by one or more system cooling fans. In any event, heat sink 295 absorbs heat from the vaporized working fluid to cause the working fluid 299 to condense from a gas back to a liquid before it returns via the heat pipe 297 to the vapor chamber 293 where the returned liquid working fluid may again absorb heat generated by CPU and GPUs 232*a* and 232*b*, be vaporized to a gas again, and recycled as before.

Although thermal module 233 of FIG. 3 employs a vapor chamber block that utilizes a single common vapor chamber 293 to cool CPU 235 and GPUs 232*a* and 232*b*, it will be understood that a thermal module 233 may alternately include two or more separate heat chambers thermally coupled to cool respective different heat generating components such as CPU 235 and GPUs 232*a* and 232*b*. In another embodiment, a thermal module may be provide that includes vapor chamber block/s having four or more contact surfaces 257 for heat spreading from four or more processing devices. e.g., two graphics boards and two CPUs, three graphics boards and one CPU, etc. Moreover, the particular orientation of thermal module 233 and CPU 235 and GPUs 232*a* and 232*b* of FIG. 3 relative to each other (as well as the relative sizes of these components to each other) is exemplary only, it being understood that other sizes, orientations and/or geometric configurations of such components may be implemented for a a multiple graphics board architecture of the disclosed systems and methods. Moreover, other types of cooling systems or configurations may alternatively be employed for thermal module 233, for example, a common heat sink thermally coupled to absorb heat from multiple GPUs 232 and/or CPUs 235, and that is coupled by a heat pipe to a conductive block that is cooled by cooling fan/s 410.

Further information on operation and configuration of heat pipes and cooling systems for information handling systems may be found in U.S. patent application Ser. No. 15/585,509 filed on May 3, 2017, which is incorporated herein by reference in its entirety.

Still referring to the embodiment of FIG. 3. GPUs 232a and 232b are not mechanically attached or otherwise mounted to separate main main board 304. Rather, GPUs 232a and 232b are mechanically coupled to opposite sides of the doubled-sided thermal module 233 as shown, with GPU 232b positioned in adjacent end-to-end and spaced relationship to main main board 304. As shown, GPUs 232a and 232b are electrically coupled by respective cables 237a and 237b (e.g., wire cables) and respective contact array interposers 315a and 315b in PCIe data communication with circuitry and CPU 235 of main board 304. In this regard, contact array interposers 315a and 315b are mounted to main motherboard 304 to transfer signals between cables 237 and main board 304 as shown. In the embodiment of FIG. 3, each of contact array interposers 315a and 315b may be, for example, a separate silicon, polyimide, or FR4 interposer having electrically conductive pins and/or pads on opposing sides joined by conductive vias and/or other type of signal conductor through the interposer body that route individual signals 389a or 389b between one of cables 237a or 237b and corresponding connections (e.g., pads) provided on main board 304 as shown. In this way, cables 237a and 237b and respective small contact array interposers 315a and 315b provide signals (e.g., PCI-Express lanes, power supply bus, power, thermal and system management signals, and graphics card power supply) between main board 304 and respective graphics boards 307a and 307b via respective signal traces on main board 304 (e.g., including signal traces extending between CPU 235 and each of contact array interposers 315) and graphics boards 307a and 307b. In this regard, cables 237a and 237b and contact array interposers 315a and 315b may be configured in one embodiment to carry a maximum graphics board power supply current that is greater than the maximum power supply capability of conventional MXM connectors 106 of FIG. 1A, thus allowing higher power graphics boards to be employed.

Figure 6:
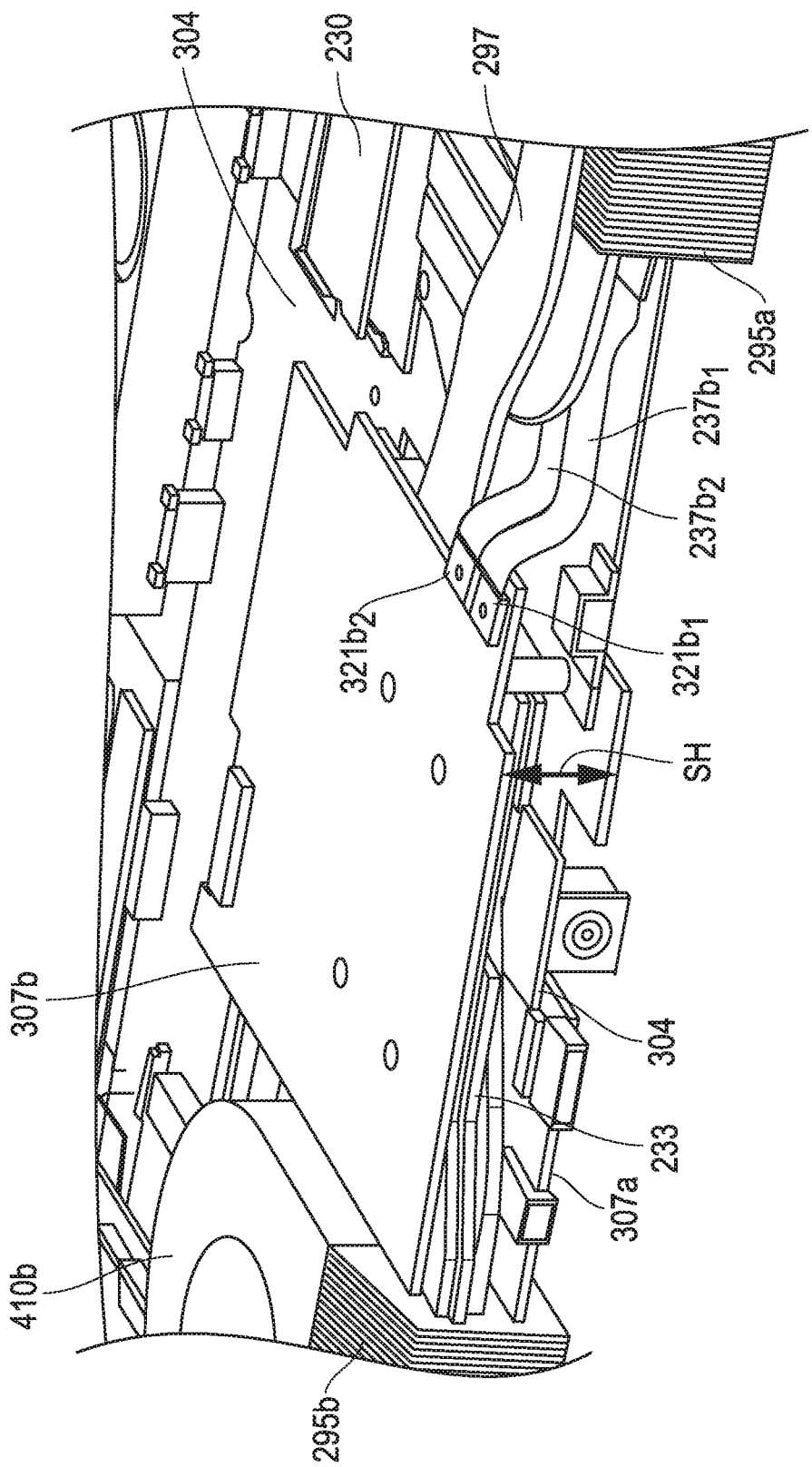
FIG. 6 illustrates a partial front perspective view of a multiple graphics board architecture according to one exemplary embodiment of the disclosed systems and methods.
Figure 7A:
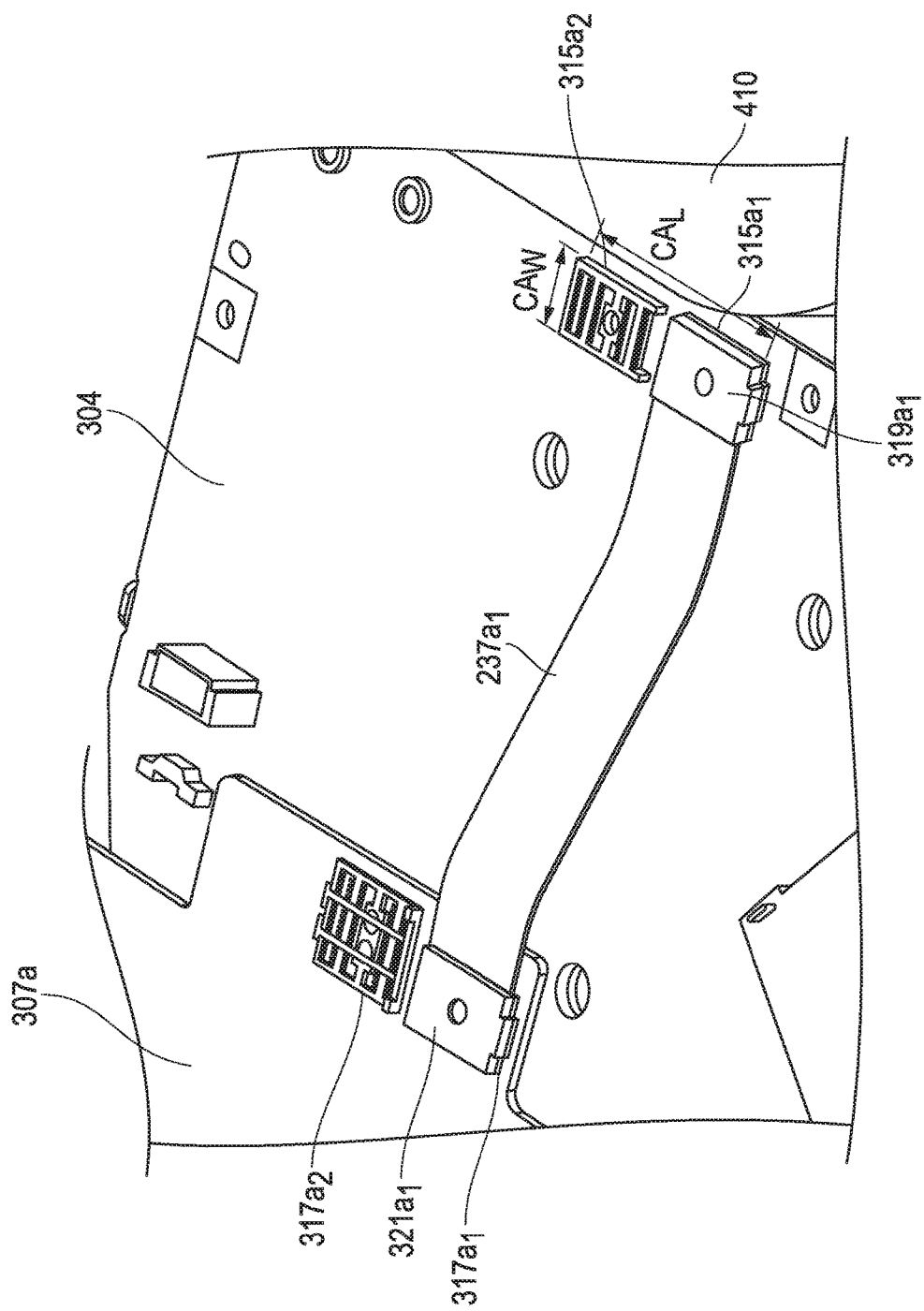
FIG. 7A illustrates a partial view of a graphics board coupled in signal communication with a main board according to one exemplary embodiment of the disclosed systems and methods.

It will be understood that each of cables 237a and 237b may itself be a combination of two or more cables (as shown in FIGS. 6 and 7A) as appropriate or needed to provide desired signal bandwidth and/or functionality, e.g., two or more cables 237 and two or more corresponding respective contact array interposers 315 may be provided to connect a single graphics board 307 and main board 304 as shown in FIGS. 6 and 7A for graphics board 307b, although the same cable configuration may also be implemented for connection to graphics board 307a. In one such embodiment illustrated in FIGS. 6 and 7A, each of contact array interposers $315b_1$ and $315b_2$ may provide 48 electrically conductive pins, and the pair of connectors $315b_1$ and $315b_2$ thus provides 96 pins to support MXM compatible connection using cables $237b_1$ and $237b_2$ as shown, it being understood that a corresponding pair of contact array interposers 315 may be similarly provided for graphics board 307a connection.

Figure 7B:
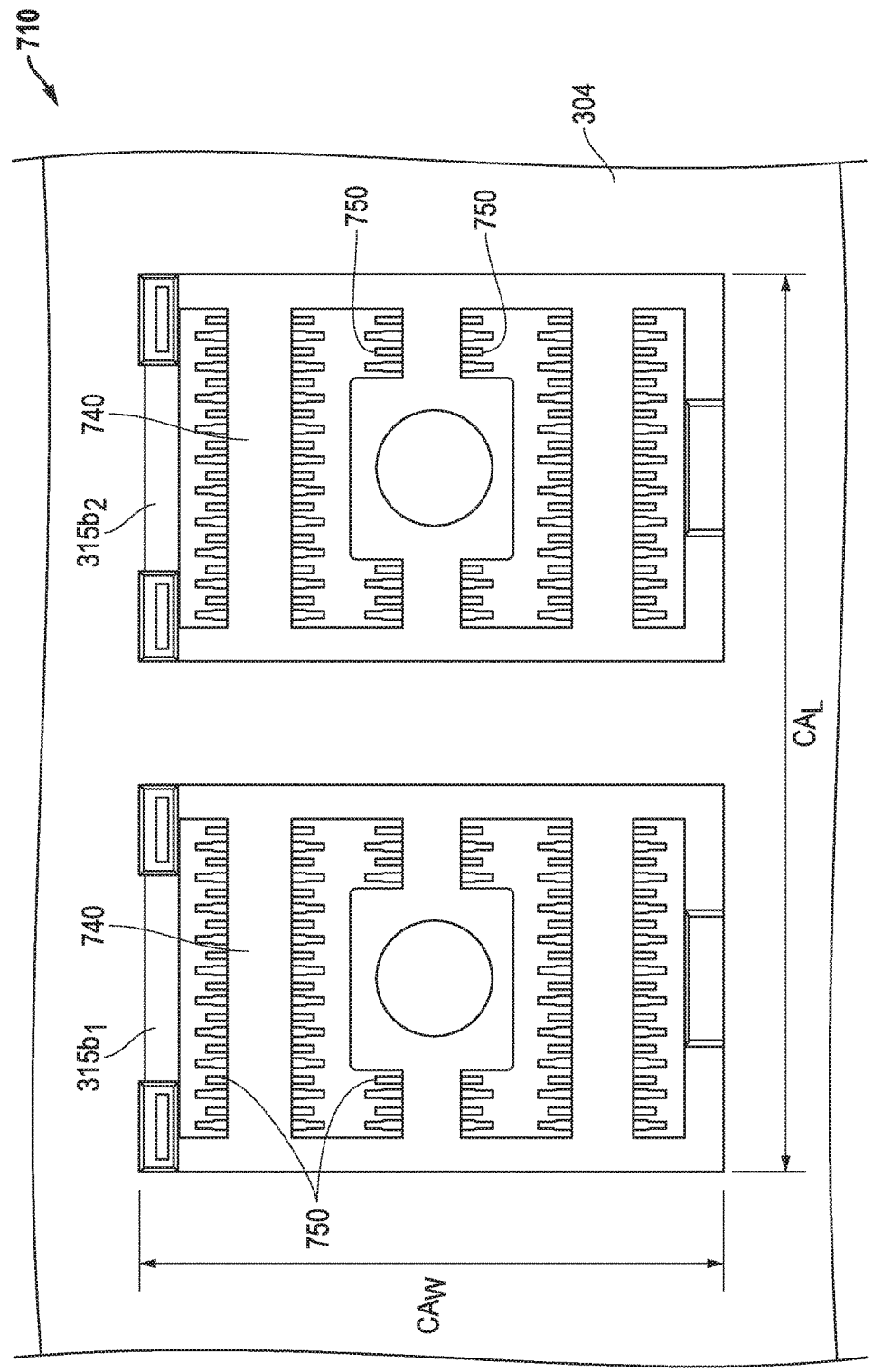
FIG. 7B illustrates a partial view of a pair of contact array interposers disposed on a main board according to one exemplary embodiment of the disclosed systems and methods.

In one embodiment, a combination of small contact array interposers $315b_1$ and $315b_2$ may be disposed in end-to-end fashion (with corresponding main board connector pattern) on main board 304 so as to present a total contact area having width ($CA_W$) of 13.5 millimeters wide×length ($CA_L$) of 7.5 millimeters deep×1 millimeter height), in contrast to the much larger dimensions (i.e., 85 millimeters wide×5 millimeters deep×7.5 millimeters height or as large as 91.2 millimeters×12.2 millimeters deep×7.5 millimeters height) of each of conventional MXM connector sockets 106 of FIG. 1A. It will be understood that the number and/or arrangement of contact array interposers 315 may vary to fit the needs of a given application. For example, FIG. 7B illustrates an alternative embodiment of a contact area 710 that may be provided by positioning small-contact array interposers $315b_1$ and $315b_2$ in a side-by-side fashion (with corresponding main board connector pattern) on main board 304 so as to present a total contact area having width ($CA_W$) of 11.25 millimeters deep×length ($CA_L$) of 17.5 millimeters. As shown in further detail of FIG. 7B, each of contact array interposers has an interposer body 740 (e.g., silicon, polyimide, or FR4) and electrically conductive pins 750. In one embodiment, the height of each contact array interposer 315 may be about 1 millimeters×1 millimeter height. It will be understood that the above-described dimensions of contact array interposers 315 and contact area 710 are exemplary only, and either or both may be greater or lesser in other embodiments.

In the exemplary embodiment of FIG. 3, main board 304 has a side-to-side width ($XW_M$) that supports the contact array interposers 315a and 315b in position for connection to the respective graphics boards 307a and 307b. As shown, graphics boards 307a and 307b have respective board widths ($XWG_{GA}$) and ($XWG_{GB}$) with $XWG_{GA}$ being larger than $XWG_{GB}$ in this embodiment such that the position of graphics board 307a overlaps (or overlays) a portion of main board 304, although graphics boards 307a and 307b may have the same width as each other in other embodiments. Overall width (OW) or main board width $XW_M$ of multiple graphics board architecture 300 (excluding heat sink 295) may in one embodiment be about 336 millimeters (and 170 millimeters deep) which is less than the required 436.8 millimeters width ($CW_M$) of conventional SLI architecture 100. In this regard, in one embodiment overall width (OW) and/or main board width ($XW_M$) of main board 304 may be less than about 436 millimeters, alternatively less than about 400 millimeters, alternatively less than about 350 millimeters, and further alternatively less than or equal to about 336 millimeters. However, it will be understood that in other embodiments, width (OW) and/or main board width ($XW_M$) of main board 304 may be greater than 436 millimeters and/or depth ($XD_M$) of main board 304 may be greater or may be less than 170 millimeters. It will be understood that overall width (OW) or main board width ($XW_M$) of multiple graphics board architecture 300 may be greater or lesser in other embodiments In the embodiment of FIG. 3, at least a portion of graphics boards 307a and 307b are mounted opposite to each other on opposite sides of thermal module 233. SLI bridge cable 236 is provided to interconnect the graphics processing units 232a and 232b of graphics boards 307a and 307b in master-slave relationship as shown. SLI bridge cable 236 transfers inter-graphics board signals 391 (e.g., multiuse Input/Output Interface signals) between the graphics boards 307a and 307b and their respective GPUs 232a and 232b. The GPU 232a of the master graphics board 307a provides output video signals to an attached display device as illustrated and described previously in relation to FIG. 2. Because the graphics boards 307a and 307b are stacked in overlapping and sandwiched relationship with the thermal module 233, the total width and/or depth of the multiple graphics board architecture 300 and the resulting projective PCB area of the embodiment of FIG. 3, may be less than the total main board width ($CW_M$) and resulting projective PCB area of the conventional architecture of FIGS. 1A-1C.

Figure 4:
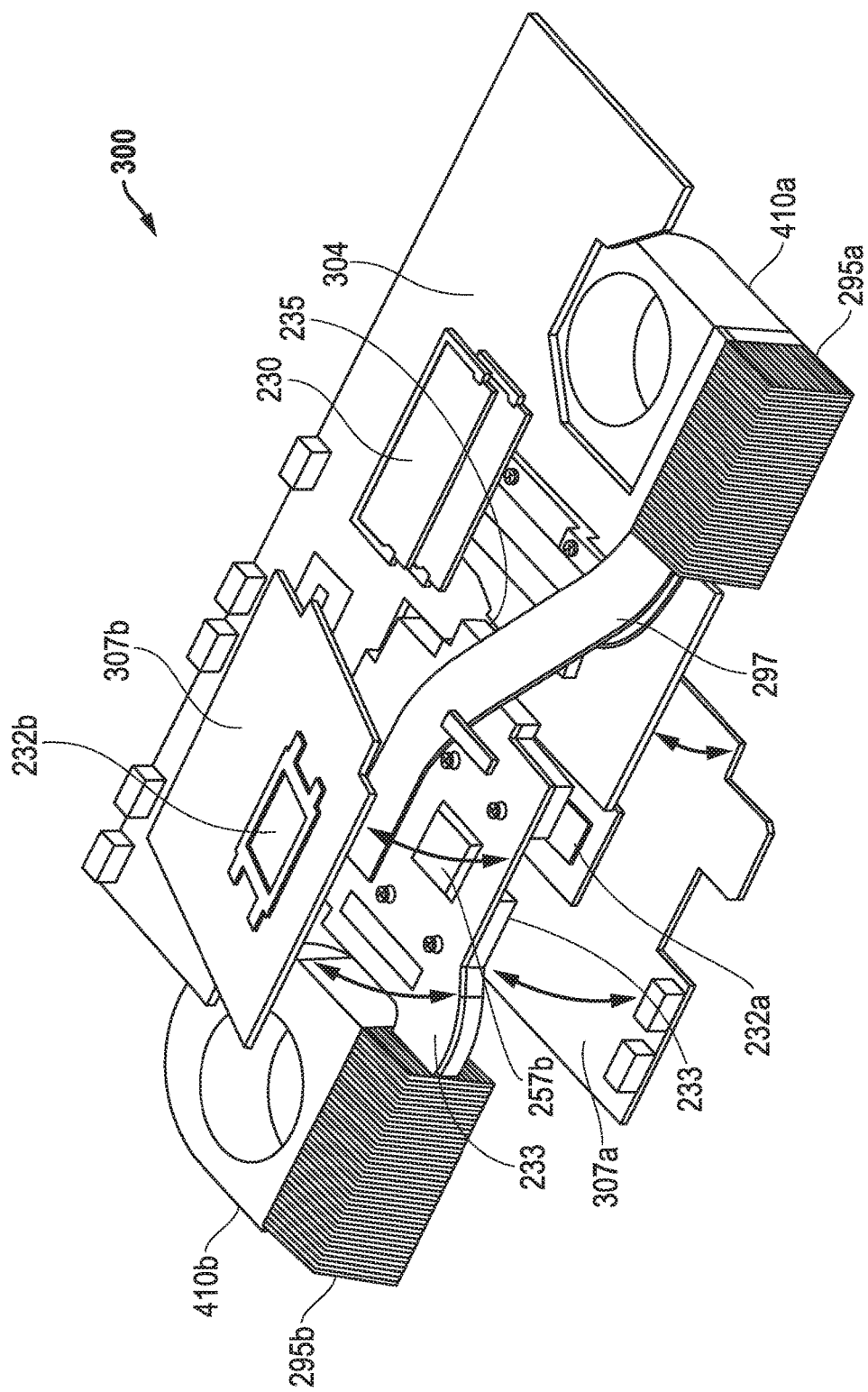
FIG. 4 illustrates an exploded front perspective view of a multiple graphics board architecture according to one exemplary embodiment of the disclosed systems and methods.

FIG. 4 illustrates an exploded front perspective view of one embodiment of a multiple graphics board architecture 300 similar to FIG. 3 as it may be configured for use within the chassis enclosure of a portable information handling system, such as a notebook computer, laptop computer, tablet computer, convertible computer, etc. In the exemplary embodiment of FIG. 4, each of graphics boards 307a or 307b is mounted to main board 304 in a position in which the outer boundaries of the graphics board is completely contained contained within the outside boundaries of main board 304 so as to minimize the areal footprint or projective PCB area of architecture 300. As shown in FIG. 4, graphics boards 307a and 307b are exploded apart so that vapor chamber of thermal module 233 mounted therebetween is visible in FIG. 4. As shown, a first cooling fan 410a is positioned to circulate cooling air drawn in through one or more cooling air inlets into chassis enclosure 205 and across cooling fins of first heat sink 295a that is coupled by heat pipe 297 to thermal module 233 for cooling CPU 235 and GPUs 232a and 232b in a manner as previously described. An optional second cooling fan 410b is positioned to circulate cooling air across cooling fins of second heat sink 295b that may also be coupled by a separate heat pipe for purposes of cooling CPU 235 and GPUs 232a and 232b. In such an embodiment, multiple fans 410a and 410b may be employed to process the concurrent heat produced by each of CPU 235 and GPUs 232a and 232b, with vapor chamber 293 and heat pipe 297 transferring heat from CPU 235 and GPUs 232a and 232b to fins of heat sinks 295a and 295b. General location of CPU 235 beneath thermal module 233 and GPUs 232b and 232a positioned above and below thermal module 233, respectively, is denoted by lead lines in FIG. 4.

Figure 5:
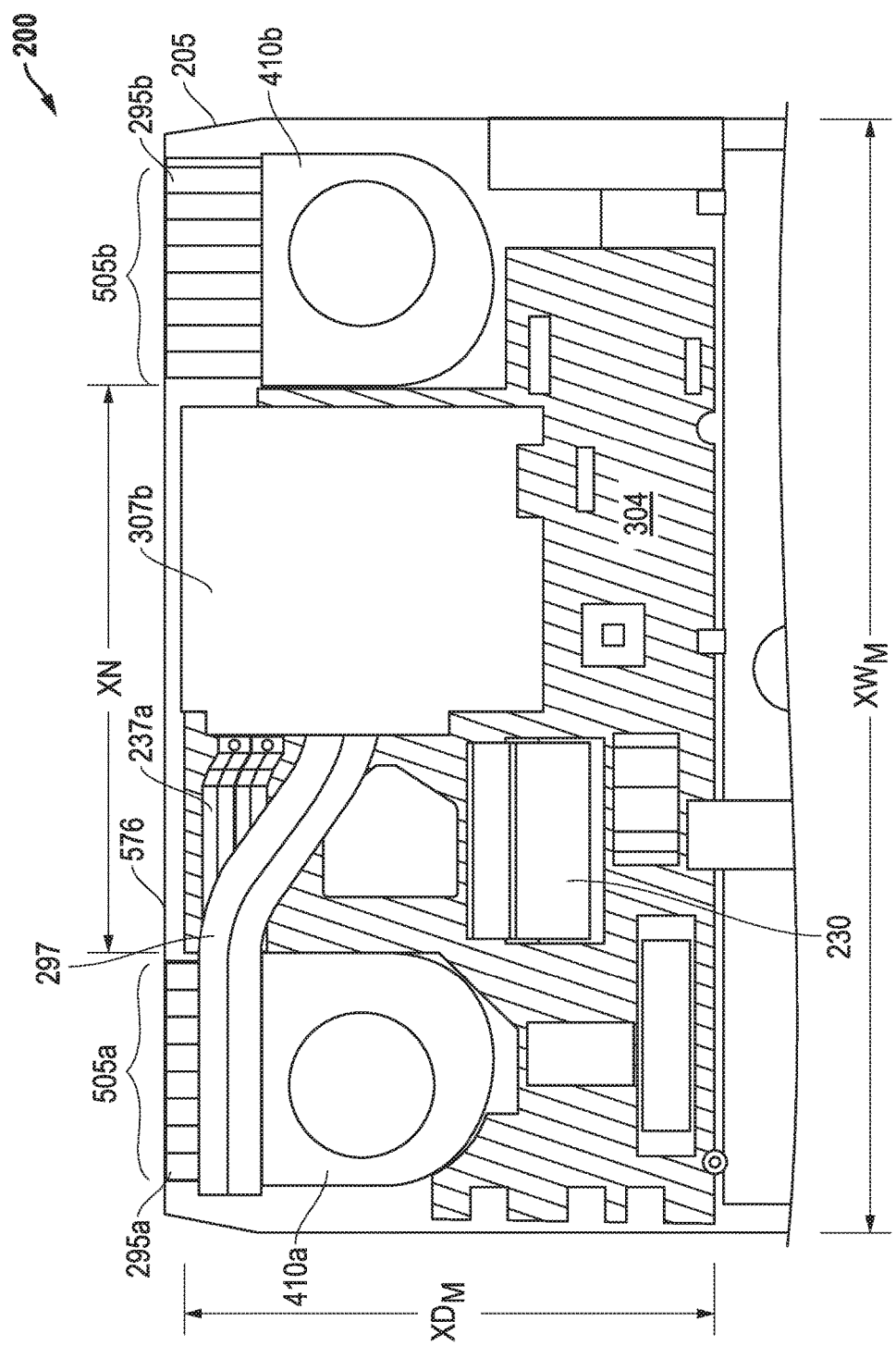
FIG. 5 illustrates a partial underside view of of one embodiment of a multiple graphics board architecture according to one exemplary embodiment of the disclosed systems and methods.

FIG. 5 illustrates a partial underside view of of one embodiment of a multiple graphics board architecture 300 as it may be configured for use within the chassis enclosure 205 of a portable information handling system 200 configured as a notebook computer. As shown in FIG. 5, a heat pipe 297 is provided to couple to a common vapor chamber 293 previously described and illustrated, and chassis enclosure vents 505a and 505b are defined in a front edge surface 576 of chassis enclosure 205 to allow hot air from respective heat sinks 295a and 295b to be exhausted by action of cooling fans 410 outside through the vents 505 to the environment outside the chassis enclosure 205.

In the embodiment of FIG. 5, a projective PCB area of architecture 300 of FIG. 5 is a surface area defined by the outermost boundary edges of main board 304 that exist within the width ($OW_M$) and depth ($OD_M$) of main board 304, e.g., projective PCB area=$OW_M \times OD_M$. In this embodiment, the the projective PCB area of multiple graphics board architecture 300 may be smaller than the projective PCB area of conventional SLI architecture 100 of FIGS. 1A-1C for the same given size graphics boards since main board 304 does not have to mechanically support graphics boards 307a or 307b thereon. Rather, graphics boards 307a or 307b are mechanically mounted in positions across from each other on opposite sides of thermal module 233, in this case with the plane of each board 307 oriented in parallel with the plane of thermal module 233 and plane of adjacent main board 304. Consequently, one or both of graphics boards 307a or 307b may in one embodiment have outer dimensions that are larger than the conventional graphics card size of 105 millimeters wide and/or 82 millimeters deep, and still fit within a chassis enclosure of the same size or smaller notebook computer employed by conventional SLI architecture of FIG. 1A. In another embodiment, main board 304 may have outer dimensions of 336 millimeters wide ($XW_M$)×170 millimeters deep ($XD_M$) which is narrower than the width of conventional motherboard 104 of FIG. 1A, which results in a smaller width and area or footprint for the same or larger graphics board power than required by conventional architecture 100 of FIGS. 1A-1C. In this regard, projective PCB area of the example exemplary embodiment of FIG. 5 is about 57120 square millimeters, compared to a projective PCB area of 69014 square millimeters for the conventional MXM solution of FIG. 1A. Thus, in this embodiment, the smaller PCB projective area of FIG. 5 results in more effective PCB usage and ability for use in smaller information handling system platforms than is possible with conventional solutions.

In one embodiment, each of MXM-compatible graphics boards 307a and 307b may have a power rating greater than 100 watts maximum each. As an example, either one or both of graphics boards 307a and 307b may each be 115 watt NVIDIA GeForce GTX 1070 laptop graphics cards mounted with architecture 300 within a chassis enclosure of a 15 inch form factor notebook computer chassis enclosure having a base component width not exceeding 380 millimeters and a base component depth not exceeding 275 millimeters inches, with a useable internal PCB clearance space of 370 millimeters wide×190 millimeters deep. Thus, in one embodiment, the disclosed multiple graphics board architecture 300 may have external dimensions sized to fit within a useable internal PCB clearance space of less than or equal to about 370 millimeters wide×less than or equal to about 190 millimeters deep. However, it will be understood that the disclosed systems and methods may be implemented in larger information handling system chassis enclosures, for example, either one or both of graphics boards 307a and 307b may each be 180 watt NVIDIA GeForce GTX 1080 laptop graphics cards mounted with architecture 300 within a chassis enclosure of a 17 inch form factor notebook computer chassis enclosure.

Still referring to FIG. 5, in one embodiment "neck" segment length (XN) between fans may be reduced (e.g., by about 20%) in length when compared to conventional designs. For example, neck segment length (XN) may be less than or equal to about 194 millimeters which allows space for dual fans when assembly 300 is installed in a 15 inch form factor notebook computer system, although greater or lesser neck segment length values are alternatively possible. Maximum overall stack height (SH) of the assembled multiple graphics board architecture 300 of FIG. 5 between graphics board PCB components 307a and 307b (with thermal module 233 therebetween) may in one exemplary embodiment be less than about 25 millimeters, alternatively from about 15 millimeters to 25 millimeters, alternatively about 20 millimeters, as shown by the double-sided arrow in partial perspective view of assembled architecture 300 shown in FIG. 6. Thus, in one exemplary embodiment, PCB stacking height (SH) of the disclosed multiple graphics board architectures may be reduced over stacking height of conventional SLI architecture 100 of FIGS. 1A-1C. It will be understood however, that the above-given example values of projective PCB areas and/or stack height of assembled multiple graphics board architecture 300 are exemplary and given only for purposes of illustration. In this regard, greater or lesser values of projective PCB areas and/or stack height are alternatively possible.

FIG. 7A illustrates a partial view of graphics board 307a coupled in signal communication with main board 304 by a cable 237$a_1$. In this embodiment, cable 237$a_1$ is a wire cable having Flexible Printed Circuit (FPC) with stiffeners and screws and connectors 319$a_1$ and 321$a_1$ on opposite ends of cable 237$a_1$ for mating and interconnection with small contact array interposer 315$a_1$ on main board 304 and corresponding connection/connector 317$a_1$ (e.g., which may be any suitable connector including a contact array interposer) on graphics board 307a. A second set of connection/connector 317$a_2$ and small contact array interposer 315$a_2$ are provided as shown for coupling a second cable 237$a_2$ in parallel signal communication with the first cable 237$a_1$ between graphics board 307a and main board 304. It will be understood that FIG. 7A is exemplary only, and that a graphics board 307 may be coupled in signal communication with a main board 304 using other types of signal conductors and connectors, including connectors other than array interposers.

Figure 8:
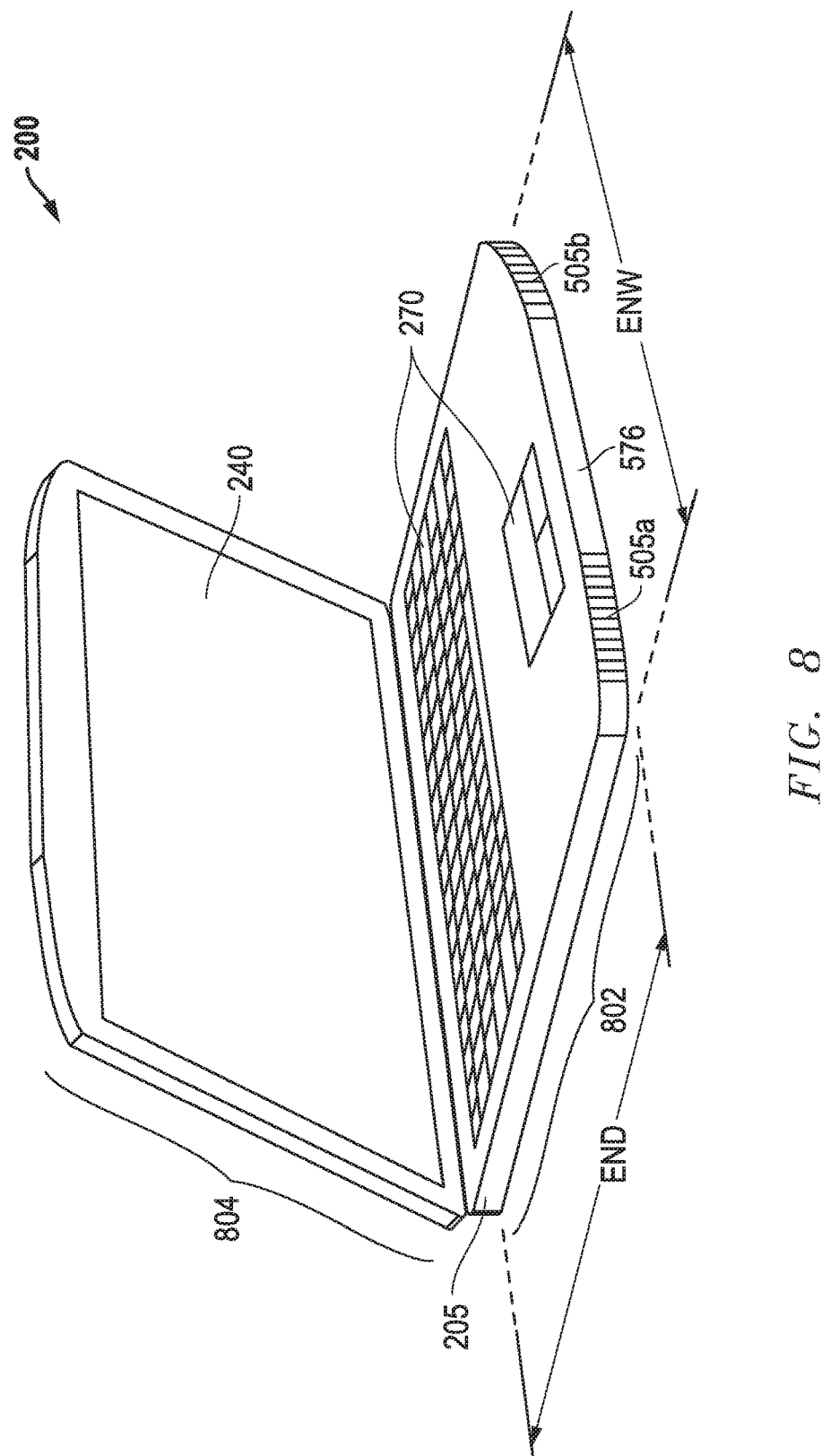
FIG. 8 illustrates a front perspective view of a portable information handling system that is configured as a notebook computer according to one exemplary embodiment of the disclosed systems and methods.

FIG. 8 illustrates a portable information handling system 200 that is configured as a notebook computer that includes a multiple graphics board architecture 300 that is disposed within the chassis enclosure 205 of the base component 802 of the system 200. As shown, chassis enclosure vents 505a and 505b are defined in the front edge surface 576 of chassis enclosure 205 to allow hot air from heat sinks 295 to be exhausted outside through the vents 505 to the environment outside the chassis enclosure 205 in a manner as previously described, although one or more vents may placed in alternate locations of chassis enclosure 205 in other embodiments. A lid 804 with display 240 is hingeably coupled to the base component 802 as shown. Based component 802 also includes I/O devices 270 in the form of keyboard and touch pad, and has an external width (ENW) and external depth (END) as shown. It will be understood that FIG. 8 is exemplary only, and that in other embodiments a multiple graphics board architecture may be provided in other types of information handling system configurations.

It will understood that one or more of the tasks, functions, or methodologies described herein (e.g., including those described herein for components 232, 235, 250, 280, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein. It will also be understood that one or more steps of the present methodologies may be employed in one or more code segments of the computer program. For example, a code segment executed by the information handling system may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed adapters, systems and methods may be utilized in various combinations and/or independently. Thus the invention is not limited to only those combinations shown herein, but rather may include other combinations.

What is claimed is:

1. A system, comprising:
   multiple graphics boards, each of the multiple graphics boards including at least one graphics processing unit (GPU) mounted to a printed circuit board (PCB);
   an evaporator disposed in a space defined between at least a first graphics board and a second graphics board of the multiple graphics boards, the evaporator being thermally coupled to simultaneously absorb heat from each of a GPU of the first graphics board and a GPU of the second graphics board;
   at least one condenser coupled in sealed fluid communication with the evaporator, the condenser not disposed between the first graphics board and the second graphics board, and the condenser being disposed completely outside the space defined between the first and second graphics boards in non-overlapping relationship with either of the first and second graphics boards; and
   a main board that includes at least one host processing device mounted to a PCB; and where the evaporator is thermally coupled to simultaneously absorb heat from each of the host processing device, the GPU of the first graphics board and the GPU of the second graphics board;

where the evaporator has opposing first and second sides; where the first graphics board and main board are mechanically mounted in a thermally-conductive manner to the first side of the evaporator with a plane of the first graphics board parallel to a plane of the main board; where the second graphics board is mechanically mounted in a thermally-conductive manner to the second side of the evaporator with a plane of the second graphics board oriented parallel to the plane of the first graphics board and the plane of the main board; where a plane of the condenser is oriented parallel to a plane of each of the first and second graphics boards; and where the condenser is disposed adjacent an edge of each of the first and second graphics boards, and lies in the same plane as the plane of each of the first and second graphics boards.

2. The system of claim 1, where the plane of the first graphics board at least partially overlaps with the plane of the second graphics board.

3. The system of claim 2, where a plane of at least one of the first graphics board or second graphics board at least partially overlaps with the plane of the main board.

4. The system of claim 1, where the GPU of the first graphics board is coupled in signal communication to the GPU of the second graphics board; where the GPU of the first graphics board and the GPU of the second graphics board are configured to perform parallel processing to together produce a single video output; and where each of the GPU of the first graphics board and the GPU of the second graphics board are independently coupled in signal communication with the host processing device by at least one contact array interposer mounted to the main board in signal communication with the host processing device.

5. The system of claim 1, where the evaporator comprises a vapor chamber; where the condenser comprises a condenser chamber of a heat sink coupled in sealed fluid communication with the vapor chamber; where a working fluid is contained within the vapor chamber and condenser chamber; and where the heat sink comprises cooling fins that are not disposed between the first graphics board and the second graphics board, the cooling fins being disposed completely outside the space defined between the first and second graphics boards in non-overlapping relationship with either of the first and second graphics boards.

6. The system of claim 1, where the GPU of the first graphics board is coupled in signal communication to the GPU of the second graphics board; and where the GPU of the first graphics board and the GPU of the second graphics board are configured to perform parallel processing to together produce a single video output.

7. An information handling system, comprising the system of claim 1, contained within a chassis enclosure; where the GPU of the first graphics board is coupled in signal communication with the host processing device by at least one first contact array interposer mounted to the first side of the main board; and where the GPU of the second graphics board is coupled in signal communication with the host processing device by at least one second contact array interposer mounted to the second side of the main board.

8. An information handling system, comprising:
a chassis enclosure;
multiple graphics boards contained within the chassis enclosure, each of the multiple graphics boards including at least one graphics processing unit (GPU) mounted to a printed circuit board (PCB); and
a main board contained within the chassis enclosure that includes at least one host processing device mounted to a PCB, the main board having opposing first and second sides and having a plane being disposed between a plane of a first one of the multiple graphics boards and a plane of a second one of the multiple graphics boards with the plane of the main board being oriented parallel to the plane of the first graphics board and the plane of the second graphics board;
where the main board is disposed within a space defined between the first graphics board and the second graphics board such that the main board is disposed between the first graphics board and the second graphics board;
where a GPU of the first graphics board is coupled in signal communication with the host processing device by at least one first contact array interposer mounted to the first side of the main board; and
where a GPU of the second graphics board is coupled in signal communication with the host processing device by at least one second contact array interposer mounted to the second side of the main board.

9. The information handling system of claim 8, where the main board is a motherboard and the host processing device is a central processing unit (CPU); and where each of the GPU of the first graphics board and the GPU of the second graphics board are independently coupled in signal communication with the CPU by the at least one first contact array interposer or the at least one second contact array interposer mounted to the respective opposing first and second sides of the motherboard; where the GPU of the first graphics board is coupled in signal communication with the GPU of the second graphics board; and where the GPU of the first graphics board and the GPU of the second graphics board are configured to perform parallel processing to together produce a single video output.

10. The information handling system of claim 9, where the information handling system is a portable information handling system comprising an integrated display device; where the GPU of the first graphics board is coupled to the GPU of the second graphics board in a master-slave relationship to perform parallel processing to together produce a single video output with the GPU of the first graphics board acting as a master and the GPU of the second graphics board acting as a slave; and where the GPU of the first processing device is coupled to provide the single video output as output video signals to the integrated display device.

11. The information handling system of claim 8, further comprising a evaporator contained within the chassis enclosure and disposed between at least the first graphics board and the second graphics board of the multiple graphics boards, the evaporator having opposing first and second sides and being thermally coupled to simultaneously absorb heat from each of the host processing device, the GPU of the first graphics board and the GPU of the second graphics board; where the GPU of the first graphics board and the host processing device of the main board are coupled in a thermally-conductive manner to the first side of the evaporator; where the GPU of the second graphics board is coupled in a thermally-conductive manner to the second side of the evaporator; where the plane of the first graphics board at least partially overlaps with the plane of the second graphics board; and where the information handling system further comprises at least one condenser coupled in sealed fluid communication with the evaporator, the condenser being separate from and not mounted on either of the first graphics board or the second graphics board and not disposed between the first graphics board and the second graphics board, and the condenser being disposed completely outside a space defined between the first and second graphics boards in non-overlapping relationship with either of the first and second graphics boards.

12. The information handling system of claim 11, where a plane of at least one of the first graphics board or second graphics board at least partially overlaps with the plane of the main board.

13. The information handling system of claim 11, where the information handling system is a portable information handling system having a lid component hingeably coupled to a base component; where the information handling system further comprises an integrated display device contained within the lid component; where the multiple graphics boards, evaporator and main board are all contained within the base component with the condenser disposed within a space defined between an edge wall of the base component an edge of each of the graphics boards and main board; and where the base component has a useable internal PCB clearance space of less than or equal to 370 millimeters wide×less than or equal to 190 millimeters deep.

14. The information handling system of claim 8, where the evaporator comprises a vapor chamber; where the condenser comprises at least one condenser chamber of a heat sink and at least one cooling fan contained within the chassis enclosure, the cooling fan configured to circulate air through the chassis enclosure to provide cooling for the condenser chamber; where a working fluid is contained within the evaporator and condenser chamber; where a plane of the condenser is oriented parallel to a plane of each of the first and second graphics boards; where the heat sink is separate from and not mounted on either of the first graphics board or the second graphics board, and comprises cooling fins that are not disposed between the first graphics board and the second graphics board, the cooling fins and condenser chamber of the heat sink are disposed completely outside the space defined between the first and second graphics boards in non-overlapping relationship with either of the first and second graphics boards; and where the cooling fins and condenser chamber are disposed adjacent an edge of each of the first and second graphics boards, and lie in the same plane as the plane of each of the first and second graphics boards.

15. The information handling system of claim 8, where only a single evaporator is contained within the chassis enclosure to simultaneously absorb heat from each of the host processing device, the GPU of the first graphics board and the GPU of the second graphics board.

16. A method, comprising:
operating separate graphics processing units of multiple graphics boards contained within a chassis enclosure of an information handling system, the multiple graphics boards including at least a first graphics board and a second graphics board, and each of the multiple graphics boards including at least one graphics processing unit (GPU) mounted to a printed circuit board (PCB);
operating at least one host processing device of a main board contained within the chassis enclosure, the main board including the at least one host processing device mounted to a PCB;
operating an evaporator contained within the chassis enclosure and disposed within a space defined between the first graphics board and the second graphics board to simultaneously absorb heat from each of the host processing device, the GPU of the first graphics board and the GPU of the second graphics board; and
operating a condenser coupled in sealed fluid communication with the evaporator and contained within the chassis enclosure with the evaporator, the condenser not disposed between the first graphics board and the second graphics board, and the condenser being disposed completely outside the space defined between the first and second graphics boards in non-overlapping relationship with either of the first and second graphics boards;
where the evaporator has opposing first and second sides; where the first graphics board and main board are mechanically mounted in a thermally-conductive manner to the first side of the evaporator with a plane of the first graphics board parallel to a plane of the main board; where the second graphics board is mechanically mounted in a thermally-conductive manner to the second side of the evaporator with a plane of the second graphics board oriented parallel to the plane of the first graphics board and the plane of the main board; where a plane of the condenser is oriented parallel to a plane of each of the first and second graphics boards; and where the condenser is disposed adjacent an edge of each of the first and second graphics boards, and lies in the same plane as the plane of each of the first and second graphics boards.

17. The method of claim 16, further comprising operating each of the GPU of the first graphics board and the GPU of the second graphics board in independent signal communication with the host processing device while operating the GPU of the first graphics board in signal communication with the GPU of the second graphics board to perform parallel processing with each other to together produce a single video output.

18. The method of claim 17, where the information handling system is a portable information handling system comprising an integrated display device; where the main board is a motherboard and the host processing device is a central processing unit (CPU); and where each of the GPU of the first graphics board and the GPU of the second graphics board are independently coupled in signal communication with the CPU by at least one contact array interposer mounted to the motherboard in signal communication with the CPU and where the method further comprises providing the single video output as output video signals to the integrated display device.

19. The method of claim 16, where only a single evaporator is contained within the chassis enclosure and where the single evaporator comprises a vapor chamber; where the condenser comprises at least one condenser chamber of a heat sink and at least one cooling fan contained within the chassis enclosure; where the heat sink comprises cooling fins that are not disposed between the first graphics board and the second graphics board, the cooling fins being disposed completely outside the space defined between the first and second graphics boards in non-overlapping relationship with either of the first and second graphics boards; and where the method further comprises operating the cooling fan to circulate air through the chassis enclosure to provide cooling for the cooling fins and condenser chamber that are disposed outside the space defined between the first and second graphics boards while circulating a working fluid between the condenser chamber and the vapor chamber of the single evaporator disposed within the space defined between the first and second graphics boards to simultaneously absorb heat from each of the host processing device, the GPU of the first graphics board and the GPU of the second graphics board.

* * * * *